United States Patent
Abdallah et al.

(10) Patent No.: US 7,061,746 B2
(45) Date of Patent: Jun. 13, 2006

(54) SEMICONDUCTOR COMPONENT WITH INTEGRATED CAPACITANCE STRUCTURE HAVING A PLURALITY OF METALLIZATION PLANES

(75) Inventors: Hichem Abdallah, Köln (DE); Jürgen Öhm, Ratingen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/511,189

(22) PCT Filed: Apr. 17, 2003

(86) PCT No.: PCT/DE03/01304

§ 371 (c)(1),
(2), (4) Date: Apr. 25, 2005

(87) PCT Pub. No.: WO03/090283

PCT Pub. Date: Oct. 30, 2003

(65) Prior Publication Data

US 2005/0219790 A1    Oct. 6, 2005

(30) Foreign Application Priority Data

Apr. 19, 2002   (DE)   ................. 102 17 566

(51) Int. Cl.
*H01G 4/30*   (2006.01)

(52) U.S. Cl. ................ 361/301.4; 361/303; 361/306.3; 257/306; 257/532; 438/393

(58) Field of Classification Search ............. 361/301.4, 361/303, 306.3, 329–330; 257/306, 309, 257/301, 536–539, 393; 438/393, 240
See application file for complete search history.

(56) References Cited

U.S. PATENT DOCUMENTS 4,802,951 A * 2/1989 Clark et al. .................. 216/56

(Continued)

FOREIGN PATENT DOCUMENTS

DE         100 19 839 A1      6/2001

(Continued)

OTHER PUBLICATIONS

"Capacity limits and matching properties of integrated capacitors," by R. Aparicio et al., IEEE Journal of Solid-State Circuits, IEEE Inc. New York, US, vol. 37, No. 3, Mar. 2002, pp. 384-393.

(Continued)

*Primary Examiner*—Anthony Dinkins
(74) *Attorney, Agent, or Firm*—Brinks Hofer Gilson & Lione

(57) ABSTRACT

A semiconductor component includes an insulating layer, which is configured on a semiconductor substrate and in which a capacitor structure is formed. The capacitor structure has at least two parallel metallization planes, whereby at least one of the planes is configured in a lattice and inhomogeneous structure, which are electrically connected to the first metallization plane, extended at least partially into the cavities of the latticework metallization plane.

35 Claims, 4 Drawing Sheets

U.S. PATENT DOCUMENTS

| | | | |
|---|---|---|---|
| 5,208,725 A | | 5/1993 | Akcasu |
| 5,583,359 A | | 12/1996 | Ng et al. |
| 5,801,428 A | * | 9/1998 | Felde et al. ............... 257/414 |
| 6,100,591 A | | 8/2000 | Ishii |
| 6,208,500 B1 | | 3/2001 | Alexander et al. |
| 6,753,218 B1 | * | 6/2004 | Devoe et al. ............... 438/240 |
| 6,885,539 B1 | * | 4/2005 | Devoe et al. ............... 361/303 |
| 6,894,329 B1 | * | 5/2005 | Deboy et al. ............... 257/285 |
| 2002/0030191 A1 | * | 3/2002 | Das et al. .................... 257/77 |

FOREIGN PATENT DOCUMENTS

| | | |
|---|---|---|
| EP | 1109227 A2 | 6/2001 |
| WO | WO 01/99163 A2 | 12/2001 |

OTHER PUBLICATIONS

"Capacity limits and matching properties of lateral flux integrated capacitors," by H. Aparicio et al., IEEE Custom Integrated Circuits Conference, San Diego, May 6-9, 2001, pp. 365-368.

* cited by examiner

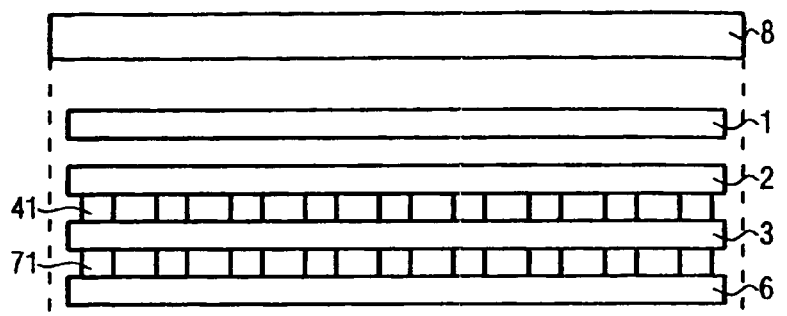
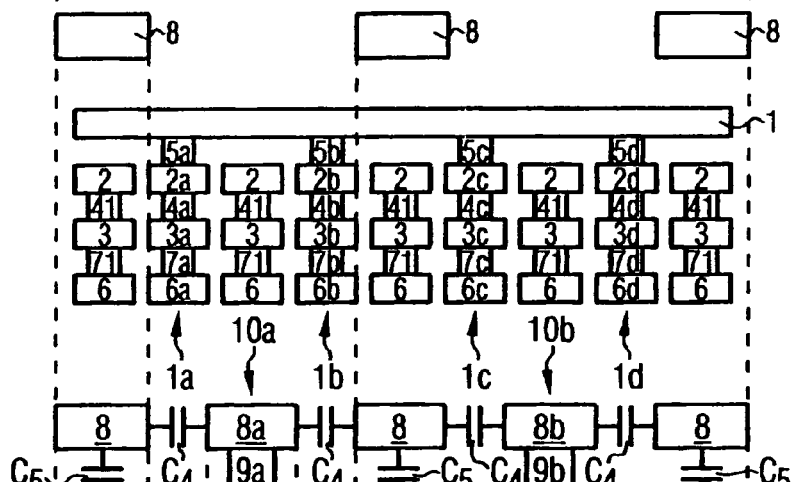
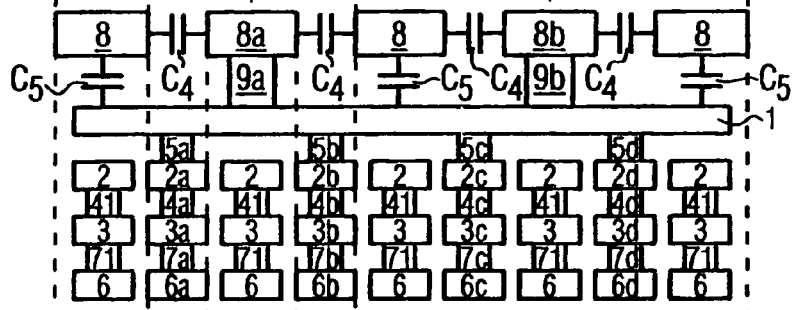
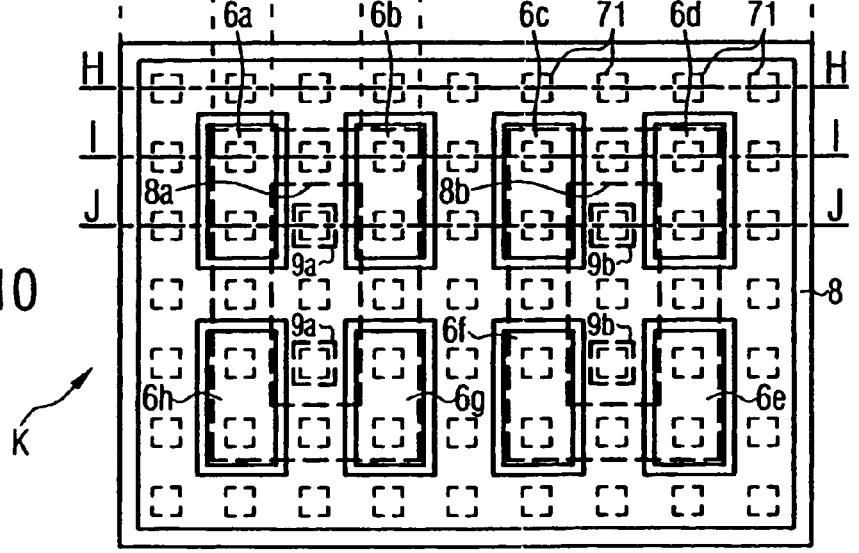

SEMICONDUCTOR COMPONENT WITH INTEGRATED CAPACITANCE STRUCTURE HAVING A PLURALITY OF METALLIZATION PLANES

RELATED APPLICATIONS

The present patent document claims priority to PCT Application Serial No. PCT/DE03/01304, filed Apr. 17, 2003, designating the United States and published in German, and German Application Ser. No. 102 17 566.7 filed Apr. 19, 2002, both of which are hereby incorporated by reference.

BACKGROUND

The present invention relates to a semiconductor component having a semiconductor substrate on which an insulating layer is formed, the insulating layer having a monolithically integrated capacitance structure formed in it.

Most analog circuit parts of hybrid digital/analog circuits require capacitors having a high capacitance value, a high level of linearity and high quality. In order to keep the costs for fabricating the component as low as possible, it is necessary for the fabrication of the capacitance structures to require as few process steps as possible. In addition, the progressive miniaturization of the components and integrated circuits also entails the demand for as little area requirement as possible for the capacitance structure.

U.S. Pat. No. 5,583,359 has disclosed a capacitance structure for an integrated circuit. In this case, a plurality of metal plates which form the electrodes of a stack capacitor are arranged above one another, isolated by dielectric layers. Each plane of a metal plate contains a metal line which is insulated from the respective plate. Contact with the metal lines is respectively made from both sides using via connections, as a result of which firstly all plates in odd-numbered positions and secondly all plates in even-numbered positions in the stack are electrically connected to one another. As a result of the plates in even-numbered positions being connected to a first connecting line and the plates in odd-numbered positions being connected to a second connecting line, adjacent plates are at different potentials and form respective pairs of electrodes in a plate capacitor. The capacitance surface is thus formed by the plate surfaces. One alternative embodiment of the electrodes is provided by virtue of the plates being in the form of strip-like lines which are arranged parallel to one another in a horizontal plane. All strips in uneven-numbered positions and all strips in even-numbered positions have one end connected to an electrical line, which is likewise in strip form, resulting in the formation of two lamellar structures which are arranged so as to interlock in the horizontal plane. This structure may also be produced in a plurality of planes arranged vertically with respect to one another. Drawbacks of this capacitance structure are the relatively low capacitance values per unit area and relatively high series resistances and series inductances of the structure.

A similar embodiment of a capacitance structure is known from U.S. Pat. No. 5,208,725. A plurality of first lines in strip form are arranged parallel to one another on a semiconductor substrate. A plurality of second lines are arranged congruently on these first lines, isolated by a dielectric layer. As a result of vertically and laterally adjacent lines being at different potentials, both capacitances between lines situated above one another and capacitances between adjacent lines are produced in one plane. In this structure too, the strip-like arrangement achieves only relatively low capacitance values per unit area and produces relatively high series resistances and series inductances.

A further capacitance structure is known from Aparicio, R. and Hajimiri, A.: Capacity Limits and Matching Properties of Lateral Flux Integrated Capacitors; IEEE Custom Integrated Circuits Conference, San Diego, May 6–9, 2001. Vertically arranged bar structures are arranged symmetrically with respect to one another. Each of the bars is constructed from metal regions and via regions which are arranged alternately on one another. The spots of metal on a bar are at a common potential. Spots of metal on adjacent bars are at different potentials. The via regions respectively make contact with two adjacent metal regions of a bar. A drawback of this structure is the only relatively low capacitance values per unit area.

A further drawback of the known capacitance structures is that they make only very inefficient use of the surface area which they take up on the chip and, measured against the required surface area, provide a relatively low capacitance value for the useful capacitance and hence have a relatively large parasitic capacitance component

SUMMARY

It is therefore an object of the present invention to provide a semiconductor component having an integrated capacitance structure which is relatively easy to produce and in which the ratio of useful capacitance to parasitic capacitance can be improved and also the series resistances and the series inductances can be reduced.

In one embodiment, a semiconductor component has a semiconductor substrate on which a layer system comprising one or more insulating layers is arranged. This insulating layer or this insulating layer system has a capacitance structure formed in it. The capacitance structure has at least two metallization planes which are spaced apart from one another in the vertical direction, the metallization planes being arranged essentially parallel to the semiconductor substrate and each being electrically connected to a connecting line. A fundamental concept of the invention is that one of the metallization planes is in lattice form and the first metallization plane is electrically connected to at least one electrically conductive, inhomogeneous structure, the electrically conductive, inhomogeneous structure extending partially between the metallization planes and partially in a cutout in the lattice-like metallization plane.

The inventive semiconductor component, particularly the capacitance structure, can be produced relatively easily—few mask steps—and in addition the ratio of useful capacitance of the capacitance structure to parasitic capacitance and also the capacitance values per unit area can be improved. A further advantage is that the design of the capacitance structure virtually does not increase the horizontal surface area requirement of the overall capacitance structure and of the overall semiconductor component, and hence the ratio of useful capacitance to required chip surface area is also significantly improved.

It is advantageous for the inhomogeneous structure to be in bar or column form. Preferably, the inhomogeneous structure is arranged essentially at right angles to the metallization planes, the inhomogeneous structure having at least one metal region and an electrically conductive connecting region which is arranged between the metal region and the first metallization plane. It is advantageous for the connecting region to be in the form of a via structure.

This allows the surface of the capacitance structure to be made as large as possible in the vertical direction and thereby makes it possible to achieve the greatest possible contribution to the useful capacitance without increasing the horizontal surface area requirement of the capacitance structure.

One preferred exemplary embodiment is characterized in that the inhomogeneous structure is arranged in one of the cutouts in the lattice-like metallization plane such that the lattice-like metallization plane and the metal region of the inhomogeneous structure are arranged in one horizontal plane.

Provision may be made for a second lattice-like metallization plane to be arranged spaced apart from and congruently with respect to the first lattice-like metallization plane, the two lattice-like metallization planes being connected to one another by electrical connections. The cutouts in the second lattice-like metallization plane may be the same size as, larger than or smaller than the cutouts in the first lattice-like metallization plane. Preferably, the inhomogeneous structure has at least one second metal region and a second connecting region. The metal regions and the connecting regions are arranged alternately in the vertical direction, the metal regions being able to be produced with the same or different dimensions in comparison with one another. It is particularly advantageous for the dimensions of the metal regions to be in a form such that the largest possible capacitance components contributing to the useful capacitance of the overall capacitance structure arise on the basis of the dimensions of the cutouts in the lattice-like metallization planes in which the metal regions are arranged. Provision may also be made for the connecting plane between the two lattice-like metallization planes to be able to be patterned essentially in line with these lattice-like metallization planes. The cutouts in the connecting plane may be produced with dimensions which are the same size as, larger than or smaller than those of the cutouts in the lattice-like metallization planes. The connecting regions formed in the inhomogeneous structure between the metal regions may have dimensions which are the same size as, larger than or smaller than the dimensions of the metal regions of the inhomogeneous structure.

In a further advantageous embodiment, a further lattice-like metallization plane in the capacitance structure is arranged parallel to the other metallization planes. This further lattice-like metallization plane is arranged on that side of the first metallization plane which is remote from the first lattice-like metallization plane, so that lattice-like metallization planes are arranged on different sides of the first metallization plane. Viewed in the vertical direction, this results in a structure comprising lattice-like metallization planes between which the first metallization plane is arranged. Advantageously, at least one second inhomogeneous, electrically conductive structure can be arranged on the side of the first metallization plane, which extends in the direction of the further lattice-like metallization plane and projects at least partially into one of the cutouts in this lattice-like metallization plane.

This allows the capacitance surface to be increased and allows the share of the useful capacitance to be increased further.

Provision may also be made for inhomogeneous structures and lattice-like metallization planes to be arranged in the vertical direction on both sides of the first metallization plane symmetrically with respect to this first metallization plane and for equivalent substructures of the total capacitance structure to be arranged on both sides of the first metallization plane. Further advantageous configurations are specified in the dependant claims.

A plurality of exemplary embodiments of the invention are explained in more detail with reference to the schematic drawings below, in which:

BRIEF DESCRIPTION OF THE DRAWINGS

FIG. 10 shows a bottom view of a third semiconductor component in accordance with a preferred embodiment of the invention;

FIG. 11 shows a first sectional illustration of the semiconductor component of FIG. 10;

FIG. 12 shows a second sectional illustration of the semiconductor component of FIG. 10; and FIG. 13 shows a third sectional illustration of the semiconductor component of FIG. 10.

In the figures, elements which are the same or have the same function are denoted by the same reference symbols.

DETAILED DESCRIPTION OF THE DRAWINGS AND THE PRESENTLY PREFERRED EMBODIMENTS

Figure 1:
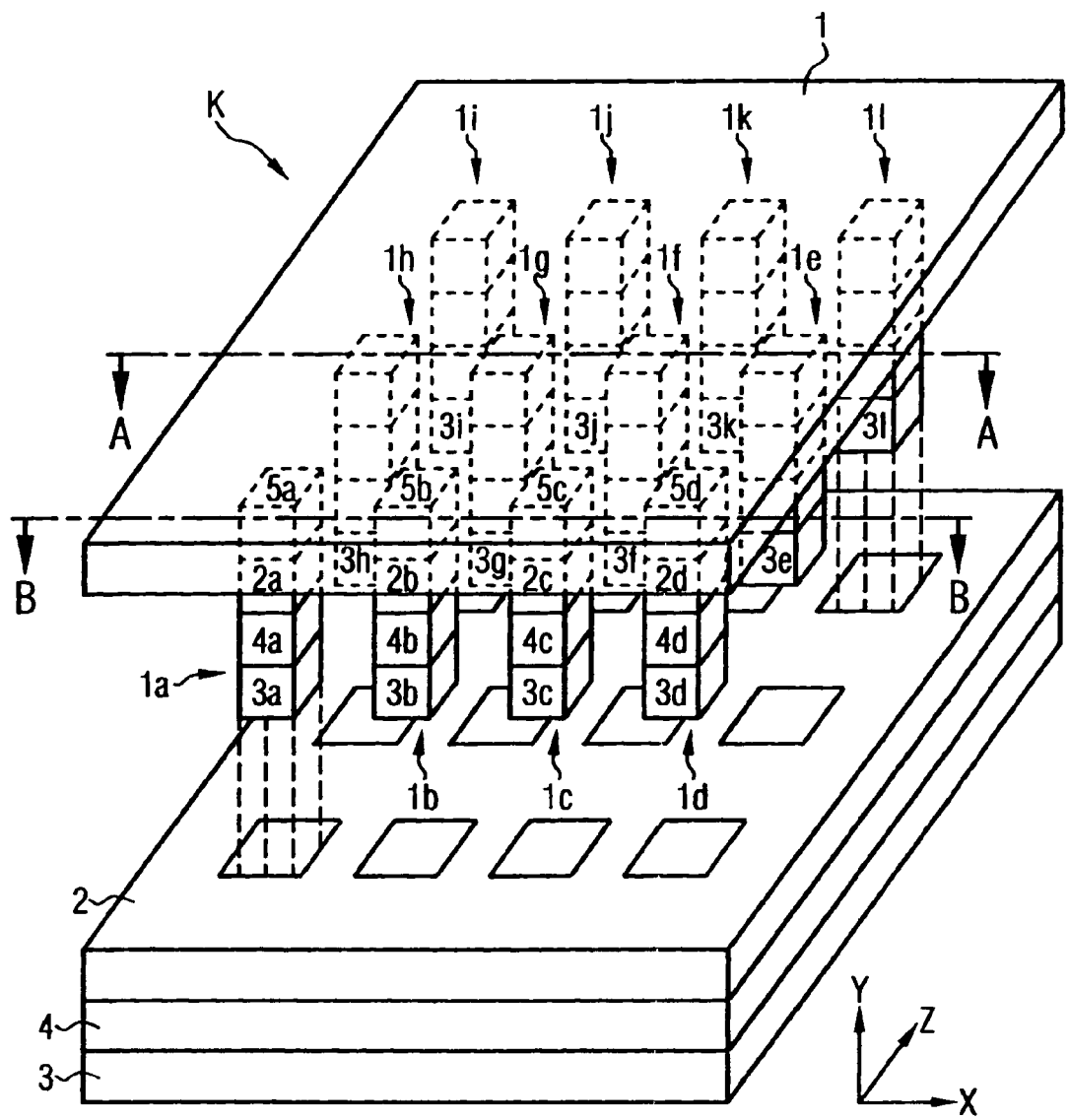
FIG. 1 shows a perspective view of a semiconductor component in accordance with a preferred embodiment of the invention.

In a first exemplary embodiment, a semiconductor component based on the invention (FIG. 1) has a semiconductor substrate (not shown) to which an insulating layer (not shown) has been applied. The insulating layer may comprise a plurality of layers. This insulating layer has a capacitance structure K integrated in it. The capacitance structure K has a first metallization plane 1, which is in the form of a homogeneous plate 1 in the exemplary embodiment.

A plurality of electrically conductive, inhomogeneous structures 1a to 1l which are in column form are arranged on the homogeneous plate 1 at right angles to the plate 1 and are oriented in the direction of a first lattice-like metallization plane 2, which represents the second metallization plane of the capacitance structure. The first lattice-like metallization plane 2 is arranged parallel to the homogeneous plate 1. In the exemplary embodiment, a second lattice-like metallization plane 3 is arranged parallel to and spaced apart from the first lattice-like metallization plane 2, the lattice-like metallization planes 2 and 3 being connected to one another by an electrically conductive connecting plane 4. The second lattice-like metallization plane 3 and the connecting plane 4 have cutouts formed in line with the first lattice-like metallization plane 2, and the planes 2, 3 and 4 are arranged with respect to one another such that the cutouts are situated congruently above one another.

The column-like, electrically conductive structures $1a$ to $1l$ each have metal regions $2a$ and $3a$ to $2l$ and $3l$. Between these metal regions a respective via structure $4a$ to $4l$ and $2a$ to $2l$ is formed. The metal regions $2a$ to $2l$ are formed in that metallization stratum in which the lattice-like metallization plane 2 is formed. Similarly, the via structures $4a$ to $4l$ are formed in that connecting stratum in which the connecting plane 4 is formed, and the metal regions $3a$ to $3l$ are formed in the metallization stratum in which the lattice-like metallization plane 3 is formed. Arranged on the metal regions $2a$ to $2l$ are the via structures $5a$ to $5l$, which are produced from a connecting stratum (not shown), this connecting stratum being removed again down to the existing vias $5a$ to $5l$.

The columns or bars $1a$ to $1l$ are arranged in the cutouts in the planes 2, 3 and 4 such that the metal regions $2a$ to $2l$ and the first lattice-like metallization plane 2, the vias $4a$ to $4l$ and the connecting plane 4, and the metal regions $3a$ to $3l$ and the lattice-like metallization plane 3 are respectively arranged in one horizontal plane. The cutouts in the planes 2, 3 and 4 are made larger than the bars $1a$ to $1l$, so that the individual regions $2a, \ldots, 5a$ to $2l, \ldots, 5l$ of each bar $1a$ to $1l$ are spaced apart from those edge regions of the respective cutout in which a single bar is arranged.

The regions between the bars $1a$ to $1l$ and the edge regions of the cutouts are filled with a dielectric material. Similarly, a dielectric layer (not shown) or insulating layer is formed between the metal homogeneous plate 1 and the lattice-like metallization plane 2. The plate 1 and the bars $1a$ to $1l$ are electrically connected to a first connecting line, and the lattice-like planes 2, 3 and 4 are electrically connected to a second connecting line in order to produce capacitor electrodes.

The capacitance structure K shown in FIG. 1 may also be in a form rotated through 180°, so that the plate 1 is closest to the semiconductor substrate, and the columns $1a$ to $1l$ extend upward in the positive y direction. Provision may also be made for the lattice-like metallization plane 3 and the connecting plane 4 and also the corresponding regions $3a$ to $3l$ and $4a$ and $4l$ of the bars $1a$ to $1l$ to be omitted. Alternatively, the capacitance structure K may be formed with further lattice-like metallization planes and connecting planes, which are arranged alternately so as to be adjacent to the lattice-like metallization plane 3.

Figure 2:
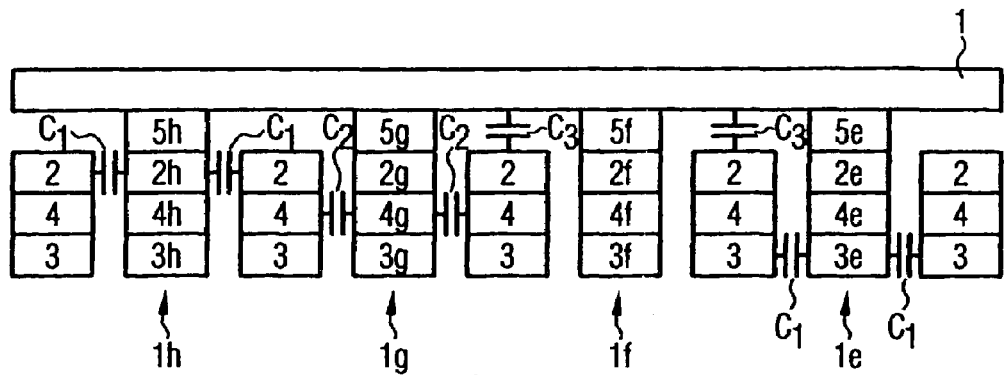
FIG. 2 shows a first sectional illustration of the semiconductor component of FIG. 1.

FIG. 2 shows a sectional illustration along the sectional line AA shown in FIG. 1. The bars $1e$ to $1h$ are spaced apart from the edge regions of the cutouts in the planes 2, 3 and 4, so that capacitance components contributing to the useful capacitance are formed between the opposing surface regions. First capacitance components $C_1$ are respectively formed between the lattice-like metallization plane 2 and the metal regions $2e$ to $2h$ of the bars $1e$ to $1h$ and between the lattice-like metallization plane 3 and the metal regions $3e$ to $3h$ of the bars $1e$ to $1h$. By way of example, these capacitance components $C_1$ are shown between the lattice-like metallization plane 2 and the metal region $2h$ of the bar $1h$ and between the lattice-like metallization plane 3 and the metal region $3e$ of the bar $1e$. Second capacitance components $C_2$ contributing to the useful capacitance of the capacitance structure K are respectively formed between the connecting plane 4 and the via regions $4e$ to $4h$ of the bars $1e$ to $1h$. By way of example, these capacitance components $C_2$ are shown between the connecting plane 4 and the via region $4g$ of the bar $1g$. In addition, capacitance components $C_3$ are produced between the metallization plane 1 and the lattice-like metallization plane 2 and likewise contribute to the useful capacitance (by way of example, FIG. 2 shows two capacitance components $C_3$).

Figure 3:
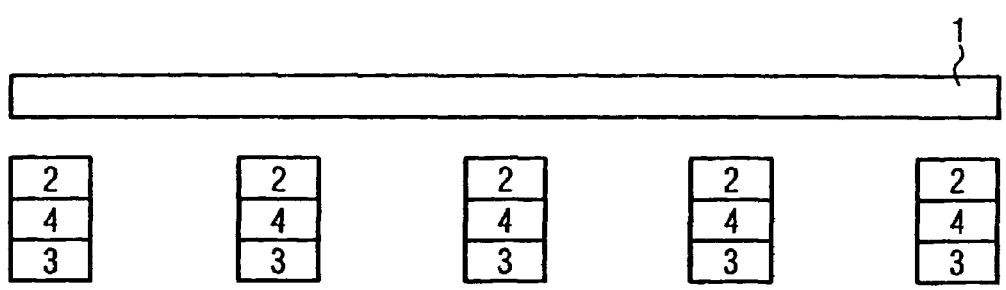
FIG. 3 shows a second sectional illustration of the semiconductor component of FIG. 1.

FIG. 3 shows a sectional illustration of FIG. 1 along the sectional line BB. This sectional line is drawn in the region of dielectric between the bars $1a$ to $1d$ and the edge regions of the cutouts in which these bars $1a$ to $1d$ are arranged.

Figure 4:
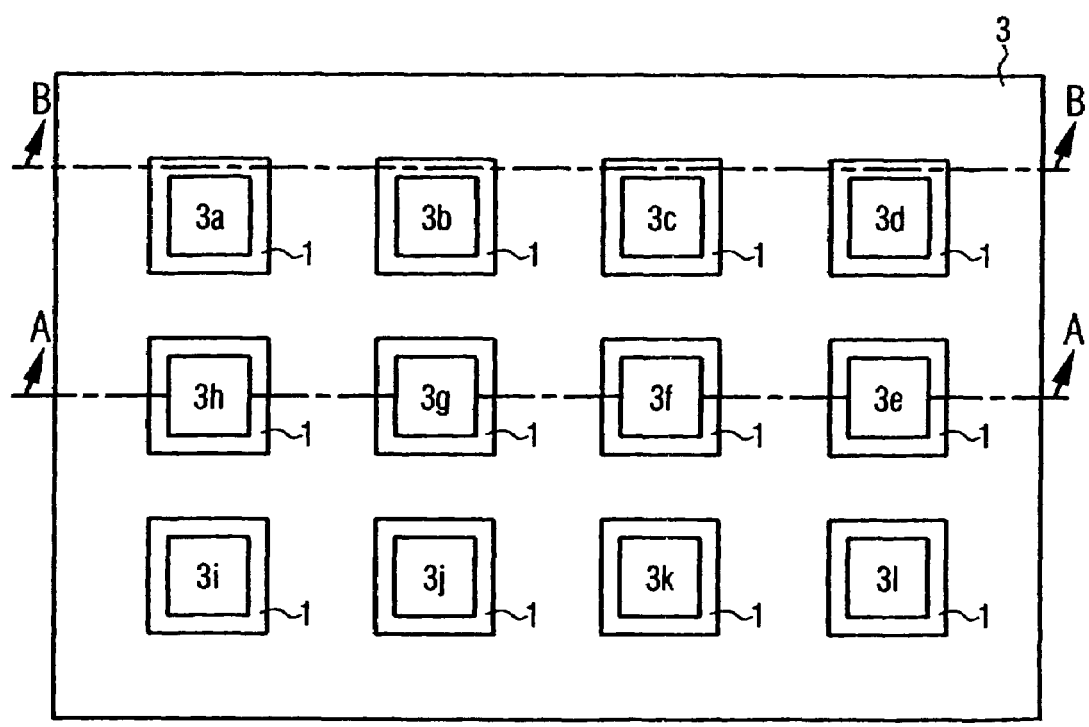
FIG. 4 shows a bottom view of the semiconductor component of FIG. 1.

An illustration with a view from below the capacitance structure K formed in FIG. 1 is shown in FIG. 4. The metal regions $3a$ to $3l$ of the bars $1a$ to $1l$ are arranged centrally in the cutouts in the lattice-like metallization plane 3. To illustrate the sectional line path of the sectional lines AA and BB, these are shown at the appropriate points.

Figure 5:
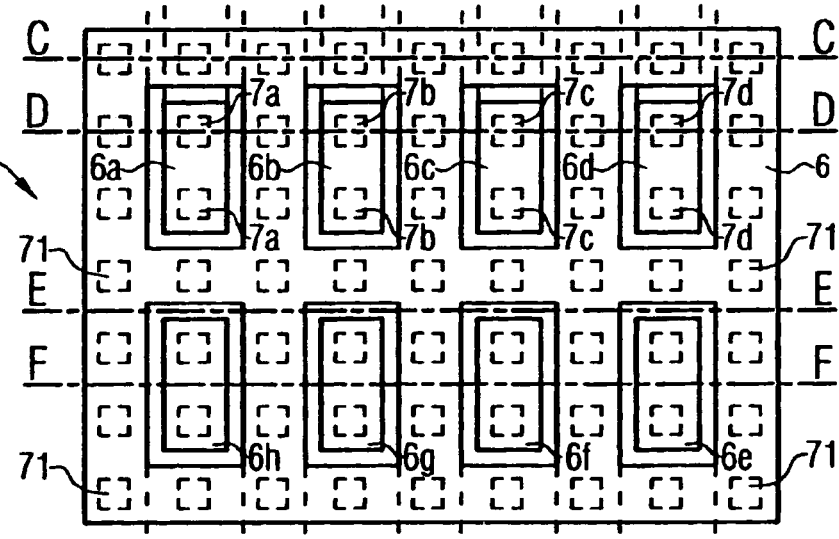
FIG. 5 shows a bottom view of a second semiconductor component in accordance with a preferred embodiment of the invention.

A second exemplary embodiment is shown in FIGS. 5 to 9. FIG. 5 shows a view from below onto the capacitance structure K. A lattice-like metallization plane 6 has rectangular cutouts in which a respective metal region $6a$ to $6h$ of a bar $1a$ to $1h$ is arranged centrally. The capacitance structure K in this exemplary embodiment has three lattice-like metallization planes 2, 3 and 6 (not shown in FIG. 5). In this exemplary embodiment, the electrical connection between these lattice-like metallization planes 2, 3 and 6 is respectively produced by column-like via structures, which are illustrated by way of example in FIG. 5 by dashed regions 71.

Figure 6:
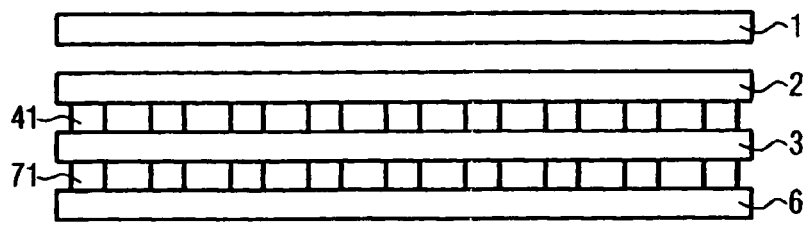
FIG. 6 shows a first sectional illustration of the semiconductor component of FIG. 5.

FIG. 6 shows a sectional illustration of the second exemplary embodiment along the sectional line CC. The lattice-like metallization plane 2 is electrically connected to the lattice-like metallization plane 3 by means of column-like vias 41. The lattice-like metallization plane 6 is electrically connected to the lattice-like metallization plane 3 by means of column-like vias 71. The first metallization plane 1 is electrically connected to a first connecting line, and the lattice-like metallization planes 2, 3 and 6 are electrically connected to a second connecting line.

Figure 7:
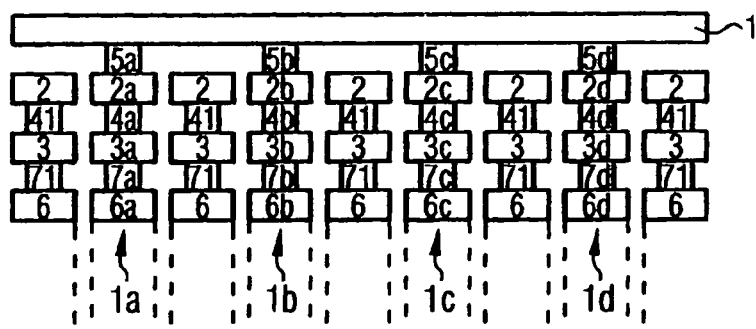
FIG. 7 shows a second sectional illustration of the semiconductor component of FIG. 5.

FIG. 7 shows a sectional illustration of the second exemplary embodiment of the capacitance structure K along the sectional line DD shown in FIG. 5. The cutouts in the three lattice-like metallization planes 2, 3 and 6 have been produced with different dimensions in this exemplary embodiment. Thus, the lattice-like metallization plane 2 has the largest cutouts and the lattice-like metallization plane 6 has the smallest cutouts. As FIG. 7 shows, the metal regions $2a$, $3a$, $6a$ to $2d$, $3d$, $6d$ of the bars $1a$ to $1d$ have been produced with different dimensions. The metal regions $6a$ to $6d$ have the largest dimensions and the metal regions $2a$ to $2d$ have the smallest dimensions. As a result, the distances between the metal regions $2a$ to $2d$, $3a$ to $3d$ and $6a$ to $6d$ and the edge regions of the cutouts in the lattice-like metallization planes 2, 3 and 6 are different in each of the planes. The vias $5a$ to $5d$ are used for electrically connecting the bars $1a$ to $1d$ to the metallization plane 1. In the exemplary embodiment, the vias 41 and the vias 71 are shown with the same dimensions as one another and are shown to be smaller than the metal regions of the lattice-like metallization planes 2, 3 and 6. Provision may also be made for these vias 41 and 71 to be produced with different dimensions and, by way of example, to be produced with the same size as or larger than the metal regions of the lattice-like metallization planes 2, 3 and 6.

Figure 8:
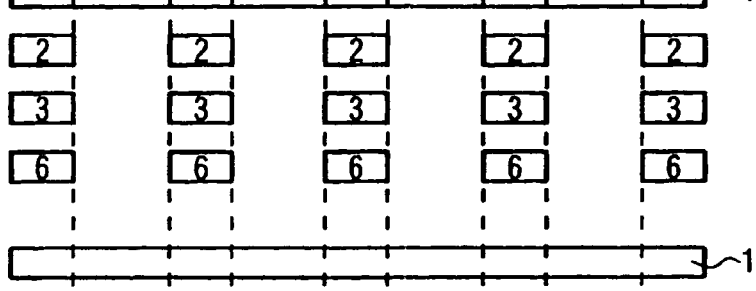
FIG. 8 shows a third sectional illustration of the semiconductor component of FIG. 5.

A further sectional illustration along the sectional line EE shown in FIG. 5 is shown in FIG. 8. This section is drawn in the region between the edge region of the cutout in the lattice-like metallization plane 6 and the metal regions $6e$ to $6h$.

Figure 9:
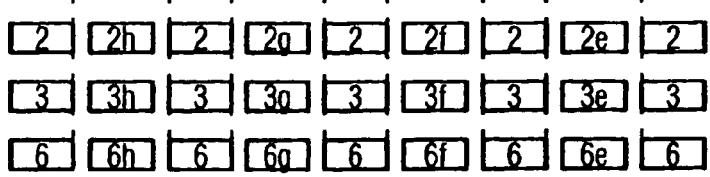
FIG. 9 shows a fourth sectional illustration of the semiconductor component of FIG. 5.

A sectional illustration along the sectional line FF in FIG. 5 is shown in FIG. 9. Neither the lattice-like metallization planes 2, 3 and 6 nor the metal regions $2e$, $3e$, $6e$ to $2h$, $3h$, $6h$ of the bars $1e$ to $1h$ are electrically connected in this case.

First capacitance components $C_1$ (not shown) contributing to the useful capacitance of the total capacitance structure K of the second exemplary embodiment (FIGS. 5 to 9) are formed between the opposing surface regions of the lattice-like metallization planes 2, 3 and 6 and the corresponding metal regions 2a, 3a, 6a to 2h, 3h, 6h of the bars 1a to 1h. Second capacitance components $C_2$ contributing to the useful capacitance are produced between the mutually facing surface regions of the via structures 41 and 71 and the corresponding connecting regions 4a and 7a to 4h to 7h of the bars 1a to 1h. In the same way as in the first exemplary embodiment shown in FIG. 2, third capacitance components $C_3$ are produced between the first metallization plane 1 and the lattice-like metallization plane 2.

A further exemplary embodiment of a capacitance structure K is shown in FIGS. 10 to 13. In line with FIG. 5, the capacitance structure shown in FIG. 10 (view from below) has metal regions 6a to 6h which are subregions of the bars 1a to 1h. In addition, the capacitance structure K has a lattice-like metallization plane 8 in whose cutouts metal regions 8a and 8b (shown in dashes) are arranged centrally. These metal regions 8a and 8b, which are in rectangular form, have larger dimensions in the exemplary embodiment than the cutouts in the lattice-like metallization planes 2, 3 and 6. Each of these metal regions 8a and 8b is respectively electrically connected to the first metallization plane 1 by two vias 9a and two vias 9b, respectively.

FIG. 11 shows a sectional illustration of the capacitance structure shown in FIG. 10 along the sectional line HH. The lattice-like metallization plane 8 is arranged above the first metallization plane 1, so that the lattice-like metallization planes 2, 3 and 6 are arranged on one side of the first metallization plane 1, and the lattice-like metallization plane 8 is arranged on the other side of the first metallization plane 1. In the exemplary embodiment, the lattice-like metallization planes 2, 3 and 6 are formed in finely patternable metallization strata, and the lattice-like metallization plane 8 is formed in a coarsely patternable metallization stratum. In this exemplary embodiment, the lattice-like metallization planes 2, 3, 6 and 8 are electrically connected to the second connecting line.

In line with the sectional illustration in FIG. 12, which shows a section along the sectional line II of the capacitance structure K in FIG. 10, it is possible to see the relatively larger cutouts in the lattice-like metallization plane 8 as compared with the cutouts in the other lattice-like metallization planes 2, 3 and 6.

A further sectional illustration is shown in FIG. 13. This figure shows a section along the sectional line JJ shown in FIG. 10. The metal region 8a and the two via structures 9a (only one via 9a can be seen in the sectional illustration) form an inhomogeneous structure 10a which is connected to the first metallization plane 1. In addition, the metal region 8b and the two vias 9b (one via 9b can be seen in the sectional illustration) form an inhomogeneous structure 10b which is likewise electrically connected to the first metallization plane 1.

The useful capacitance of the capacitance structure K shown in FIGS. 10 to 13 contains capacitance components $C_1$, $C_2$ and $C_3$ which are produced in line with those in the second exemplary embodiment (FIGS. 5 to 9). Further capacitance components $C_4$ (FIG. 13) contributing to the useful capacitance are produced between mutually facing surface regions between the metal regions 8a and 8b and the cutouts in the lattice-like metallization plane 8. In addition, capacitance components $C_5$ (FIG. 13) contributing to the useful capacitance are produced between the mutually facing surface regions of the lattice-like metallization plane 8 and the first metallization plane 1.

The number of bars and the cutouts in the respective lattice-like planes is not limited to the number shown in the exemplary embodiments, but rather can be extended in the horizontal direction in diverse ways and in a plurality of additional bars and cutouts.

Provision may also be made for a plurality of lattice-like metallization planes produced in line with the lattice-like metallization plane 8 to be arranged on one another. It is also possible for the substructure of the capacitance structure K, which substructure is produced by the bars 1a to 1h, by the lattice-like metallization planes 2, 3 and 6 and by the connecting regions 41 and 71, to be arranged symmetrically on that side of the first metallization plane 1 which is remote from this substructure. A symmetrical arrangement of this type is generally possible in all forms of the capacitance structure K of the inventive semiconductor component. Provision may also be made for the first metallization plane 1 likewise to be in lattice form and to have cutouts in symmetric or asymmetric form.

The electrically conductive connecting strata between the metallization strata can be regarded in modern integration processes basically as a separate stratum which can be patterned as appropriate for the metallization strata. This makes it possible to construct electrically conductive structures which have a vertical orientation with respect to the semiconductor substrates and can obtain total vertical heights of up to several microns. The connecting planes and the metallization planes may be able to be patterned in the same way, depending on the technology used. As a result, the inhomogeneous structures connected to the first metallization plane 1 may have connecting regions between the metal regions which essentially correspond to these metal regions. In this case, the inhomogeneous structure is formed by essentially identical metal regions arranged on one another.

The capacitance structure K of the inventive semiconductor component firstly allows relatively high useful capacitance values per unit area to be achieved and secondly allows the parasitic capacitance for or in the capacitor electrodes to be kept relatively small. In addition, the series resistances and the series inductances in the capacitance structure K can be kept relatively small. The semiconductor component having a capacitance structure in such a form is therefore particularly suitable for use in the GHz frequency range.

In all of the exemplary embodiments, it is possible to fabricate a capacitance structure K which can be produced with relatively little complexity—relatively few mask steps—and which produces a relatively large capacitance surface, which can be used to improve the ratio of useful capacitance to parasitic capacitance, given virtually unchanged horizontal surface area requirement for the capacitance structure on the chip surface.

The invention is not limited to the capacitance structures K shown in the exemplary embodiments, but rather can be produced in diverse ways. All of the exemplary embodiments shown can be transferred as appropriate to a multiplicity of integration processes with a plurality of finely or coarsely patternable metallization strata (wiring planes). The number of metallization strata and their relative layer thicknesses and vertical distances from one another do not replace the ideas indicated here, but rather are to be regarded merely as equivalent means or alternative embodiments for implementing the concepts illustrated herein.

It is therefore intended that the foregoing detailed description be regarded as illustrative rather than limiting, and that it be understood that it is the following claims, including all equivalents, that are intended to define the spirit and scope of this invention.

What is claimed is:

1. A semiconductor component comprising:
a semiconductor substrate;
an insulating layer formed in the semiconductor substrate; and
a capacitance structure formed in the insulating layer, the capacitance structure comprising:
at least two metallization planes spaced apart from one another in a vertical direction, the at least two metallization planes extending essentially parallel to the semiconductor substrate and connected to a first connecting line;
wherein a first metallization plane of the at least two metallization planes is in lattice form and electrically connected to at least one electrically conductive, inhomogeneous structure extending partially between the at least two metallization planes through a cutout in the first metallization plane.

2. The semiconductor component of claim 1, wherein the at least one inhomogeneous structure is in bar form.

3. The semiconductor component of claim 2, wherein
the at least one inhomogeneous structure comprises at least one metal region and at least one electrically conductive connecting region formed between a metal region and the first metallization plane; and
wherein the at least one inhomogeneous structure is arranged at substantially right angles to the at least two metallization planes.

4. The semiconductor component of claim 3, wherein the at least one inhomogeneous structure is arranged in a cutout in the first metallization plane such that the first metallization plane and the metal region of the at least one inhomogeneous structure are arranged in one horizontal plane.

5. The semiconductor component of claim 4 wherein a second metallization plane in lattice form is arranged congruently with respect to, and spaced apart from, the first metallization plane, and the first and second metallization planes are connected by electrical connections.

6. The semiconductor component of claim 5 wherein cutouts in the second metallization plane are the same size as cutouts in the first metallization plane.

7. The semiconductor component of claim 5 wherein cutouts in the second metallization plane are larger than cutouts in the first metallization plane.

8. The semiconductor component of claim 5 wherein cutouts in the second metallization plane are smaller than cutouts in the first metallization plane.

9. The semiconductor component of claim 5 wherein the inhomogeneous structure comprises at least two metal regions and at least two connecting regions, the at least two metal regions and the at least two connecting regions being arranged alternately.

10. The semiconductor component of claim 9 wherein the at least two metal regions are the same dimensions.

11. The semiconductor component of claim 9 wherein the at least two metal regions are different dimensions.

12. The semiconductor component of claim 5 wherein the electrical connections form a connecting plane, the connecting plane patterned essentially in line with the first and second metallization planes.

13. The semiconductor component of claim 12 wherein cutouts in the connecting plane are same dimensions as cutouts in the first and second metallization planes.

14. The semiconductor component of claim 12 wherein cutouts in the connecting plane are larger than cutouts in the first and second metallization planes.

15. The semiconductor component of claim 12 wherein cutouts in the connecting plane are smaller than cutouts in the first and second metallization planes.

16. The semiconductor component of claim 12, wherein the capacitance structure comprises a third metallization plane in lattice form, arranged parallel to the at least two metallization planes and formed on a side of a metallization plane closest to the semiconductor substrate which is remote from the first metallization plane.

17. The semiconductor component of claim 16 wherein a second electrically conductive, inhomogeneous structure is formed on a side of the metallization plane closest to the semiconductor substrate which is remote from the first inhomogeneous structure, the second electrically conductive, inhomogeneous structure extending at least partially into the cutouts in the third metallization plane.

18. The semiconductor component of claim 17 wherein the first and second inhomogeneous structures and the at least two metallization planes are arranged in a vertical direction on both sides of the first metallization plane symmetrically with respect to the first metallization plane.

19. A semiconductor component comprising:
a semiconductor substrate;
an insulating layer formed on the semiconductor substrate; and
a capacitance structure formed in the insulating layer, the capacitance structure comprising:
at least two metallization planes spaced apart from one another in a vertical direction, the at least two metallization planes extending essentially parallel to the semiconductor substrate and connected to a first connecting line;
wherein a first metallization plane of the at least two metallization planes is in lattice form and electrically connected to at least one electrically conductive, inhomogeneous structure extending partially between the at least two metallization planes through a cutout in the first metallization plane; and
further wherein a second metallization plane of the at least two metallization planes in lattice form and arranged congruently with respect to and spaced apart from the first metallization plane; and
further wherein the first and second metallization planes are electrically connected by electrical connectors.

20. The semiconductor component of claim 19 wherein the at least one inhomogeneous structure is in bar form.

21. The semiconductor component of claim 20 wherein the at least one inhomogeneous structure is arranged essentially at right angles to the at least two metallization planes; and
further wherein the at least one inhomogeneous structure comprises:
at least one metal region; and
an electrically conductive connecting region formed between the at least one metal region and the first metallization plane.

22. The semiconductor component of claim 21 wherein the at least one inhomogeneous structure is arranged in a cutout in the first metallization plane such that the first metallization plane and the at least one metal region of the at least one inhomogeneous structure are arranged in a horizontal plane.

23. The semiconductor component of claim 22 wherein cutouts of the second metallization plane are the same size as cutouts of the first metallization plane.

24. The semiconductor component of claim 22 wherein cutouts of the second metallization plane are larger than cutouts of the first metallization plane.

25. The semiconductor component of claim 22 wherein cutouts of the second metallization plane are smaller than cutouts of the first metallization plane.

26. The semiconductor component of claim 22 wherein the at least one inhomogeneous structure comprises at least two metal regions and at least two connecting regions, the at least two metal regions and at least two connecting regions arranged alternately.

27. The semiconductor component of claim 26 wherein the at least two metal regions are the same dimensions.

28. The semiconductor component of claim 26 wherein the at least two metal regions have the same dimensions.

29. The semiconductor component of claim 26 wherein the electrical connectors are formed in a connecting plane, the connecting plane patterned essentially in line with the first and second metallization planes.

30. The semiconductor component of claim 29 wherein cutouts in the connecting plane are the same size as cutouts in the first and second metallization planes.

31. The semiconductor component of claim 29 wherein cutouts in the connecting plane are larger than cutouts in the first and second metallization planes.

32. The semiconductor component of claim 29 wherein cutouts in the connecting plane are smaller than cutouts in the first and second metallization planes.

33. The semiconductor component of claim 1, wherein the capacitance structure comprises a third metallization plane in lattice form, arranged parallel to the first and second metallization planes, the third metallization plane of the capacitance structure formed on a side of a metallization plane closest to the semiconductor substrate which is remote from the first metallization plane.

34. The semiconductor component of claim 33, wherein a second electrically conductive, inhomogeneous structure is formed on the side of the metallization plane closest to the semiconductor substrate which is remote from the first inhomogeneous structure, the second electrically conductive, inhomogeneous structure extending at least partially into cutouts in the third metallization plane formed on this side.

35. The semiconductor component of claim 19 wherein the at least one inhomogeneous structure and the at least two metallization planes are arranged in a vertical direction on both sides of the first metallization plane symmetrically with respect to the first metallization plane.

* * * * *